United States Patent [19]
Effelsberg

[11] Patent Number: 5,900,649
[45] Date of Patent: May 4, 1999

[54] ELECTRONIC ASSEMBLY HAVING IMPROVED THERMAL CHARACTERISTICS

[75] Inventor: Uwe Effelsberg, Waldbronn, Germany

[73] Assignee: Hewlett-Packard Company, Palo Alto, Calif.

[21] Appl. No.: 08/598,428

[22] Filed: Feb. 8, 1996

[30] Foreign Application Priority Data

Feb. 18, 1995 [EP] European Pat. Off. .............. 95102302

[51] Int. Cl.⁶ .............................. G01J 5/20; H01L 31/08
[52] U.S. Cl. .......................... 257/81; 257/440; 257/444; 257/462; 257/461
[58] Field of Search .............................. 257/81, 40, 455, 257/442, 440, 461, 459, 444

[56] References Cited

U.S. PATENT DOCUMENTS

| | | | |
|---|---|---|---|
| 4,560,286 | 12/1985 | Wickersheim | 374/131 |
| 4,816,634 | 3/1989 | Lentz et al. | 219/10.55 |
| 4,841,170 | 6/1989 | Eccleston | 307/310 |
| 5,130,776 | 7/1992 | Popovic et al. | 257/461 |
| 5,182,624 | 1/1993 | Tran et al. | 257/40 |
| 5,247,183 | 9/1993 | Tocci | 250/551 |
| 5,282,121 | 1/1994 | Bornhurst et al. | 362/294 |
| 5,459,348 | 10/1995 | Smith | 257/659 |
| 5,551,283 | 9/1996 | Manaka et al. | 73/31.01 |
| 5,600,143 | 2/1997 | Roberts et al. | 250/349 |

FOREIGN PATENT DOCUMENTS

| | | | |
|---|---|---|---|
| 0148703 | 7/1985 | European Pat. Off. | 5/20 |
| 8625150 | 1/1987 | Germany | 7/20 |
| WO90/05633 | 5/1990 | WIPO | 3/26 |

OTHER PUBLICATIONS

Above reference cited in the EPO Search Report for EPO Application No.,95102302.7 dated Jul. 14, 1995.

Primary Examiner—Minh-Loan Tran
Assistant Examiner—Alexander Oscar Williams
Attorney, Agent, or Firm—Augustus W. Winfield

[57] ABSTRACT

A system and method of improving the thermal characteristics of a system having at least two electronic devices (100, 102; 300, 302) connected to a common substrate (104; 304). Thermal characteristics include the amount of heat transferred from one device to another and spatial uniformity of heat transferred from one device to another. Thermal conductive paths between two electronic devices are lengthened by forming an opening (200; 306) through the substrate between the two devices. Heat conduction between the devices is reduced due to increased radiation and convection in the longer thermal conductive paths. The uniformity of heat distribution between the devices is improved due to a narrower range of conducting path lengths. In a specific embodiment, heat conduction is reduced between amplifiers and photosensors used in spectrometers. In the specific embodiment, a temperature sensor (308) is used to further reduce thermal effects.

5 Claims, 3 Drawing Sheets

ELECTRONIC ASSEMBLY HAVING IMPROVED THERMAL CHARACTERISTICS

BACKGROUND OF THE INVENTION

1. Field of Invention

The invention relates to electronic assemblies and more particularly to reducing heat conduction between devices mounted on a thermally conductive substrate.

2. Description of the Prior Art

It is common in semiconductor electronics and other electronic systems to mount multiple devices on a thermally conductive substrate. In some systems, some devices may be temperature sensitive and other devices may have varying power dissipation. For example, individual photo sensors or arrays of photo sensors may be mounted onto a ceramic substrate along with various heat producing devices such as amplifiers and microprocessors. Examples of photo sensor arrays include photodiode arrays and charge coupled device (CCD) arrays. Most photo-sensitive devices are affected by temperature. Temperature change impacts both accuracy and precision. For example, for charge coupled devices, dark current, a thermally generated noise source, increases with temperature. For photodiodes, diode leakage increases substantially with temperature. In addition, quantum efficiency changes with temperature and is a function of wavelength. In general, for arrays of photosensitive devices, temperature problems are made worse when temperature variations are nonuniform over the surface of the array. In addition, the problems are made worse when sensor temperature is a function of the measured signal.

One conventional technique for partially compensating for the effects of temperature is to use a heat sink. For example, see PCT/US90/05633. In PCT/US90/05633 a heat sink is attached directly to the back of a charge coupled device array and the combination is attached to a circuit board. Heat sinks are able to improve temperature uniformity over a surface and to keep the temperature close to the surrounding environment. However, heat sinks add size and weight to an assembly. In addition, as illustrated in PCT/US90/05633, a heat sink may require a special mounting arrangement to avoid interfering with optical sensors.

Another technique for partially compensating for the effects of temperature is to add temperature sensing devices. For example, see EP-B-0 148 703. In EP-B-0 148 703, temperature sensitive elements are used to directly compensate a voltage output signal. Adding temperature sensing devices can compensate for electronic effects of nonuniform temperature. However, temperature may also have mechanical effects (dimensional changes) and the temperature sensing devices cannot decrease the temperature or make the temperature uniform. In addition, the sensing devices may provide an additional source of heat.

Still another technique for compensating for the effects of temperature is to actively stabilize the temperature, for example with a Peltier element in contact with the temperature sensitive device. However, these devices are typically expensive and typically add size, weight and complexity to the overall system.

SUMMARY OF THE INVENTION

Given a system in which at least two devices are mounted onto a common thermally conductive substrate, the primary object of the invention is to decrease the thermal effects of at least one of the devices on at least one other device. Thermal effects include the amount of heat transferred and the uniformity of the heat transferred. An additional object is to decrease thermal effects in an uncomplicated and cost effective manner. In an example embodiment, conductive heat from an operational amplifier is partially isolated from a nearby photodiode array. In addition, in the example embodiment, a temperature sensor is used to further compensate for heat transfer from the operational amplifier to the photodiode array.

In the invention, the thermal conductivity is decreased between a device with varying temperature and a temperature sensitive device. The thermal conductivity is decreased by forming an opening in the substrate between the temperature varying device and the temperature sensitive device. Forming an opening in the substrate increases the thermal path lengths between the two devices, thereby decreasing the net thermal conductivity of the substrate between the devices. As a result of the longer thermal path lengths, heat reaching the temperature sensitive device is lower amplitude (more heat is dissipated before reaching the temperature sensitive device) and the temperature distribution of the heat reaching the temperature sensitive device is more uniform. In addition, the formed opening has low complexity and low cost.

DESCRIPTION OF THE PREFERRED EMBODIMENTS

Figure 1:
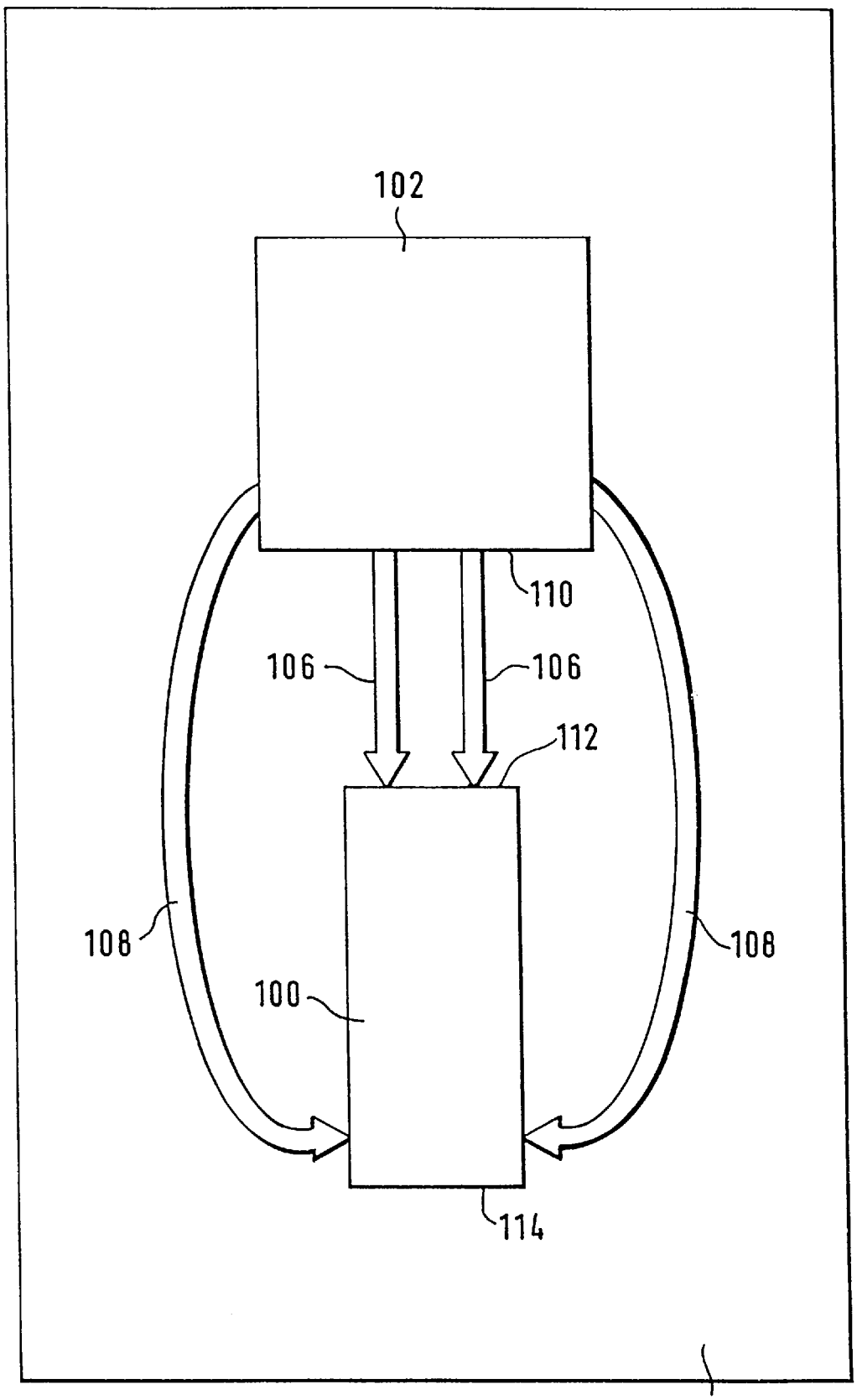
FIG. 1 is a top view of an electronic assembly having two devices mounted onto a heat conductive substrate.

FIG. 1 illustrates an electronic assembly comprising a first electronic device 100 and a second electronic device 102, both mounted onto a common thermally conductive substrate 104. Arbitrarily for illustration, device 102 is assumed to have a variable power dissipation and device 100 is assumed to be temperature sensitive. Arrows 106 and 108 indicate heat flowing through the substrate 104 from device 102 to device 100. Arrows 106 also indicate the shortest straight paths between the devices. Device 100 is depicted as a long narrow device to illustrate non-uniformity of heat transfer. Note that the length of the thermally conductive paths represented by arrows 106 (the shortest paths between the two neighboring device edges 110 and 112), are substantially shorter than the conductive paths illustrated by arrows 108 (towards edge 114 at the opposite end of device 100 from edge 112). As a result, there is a substantial non-uniformity in heating for device 100.

Figure 2:
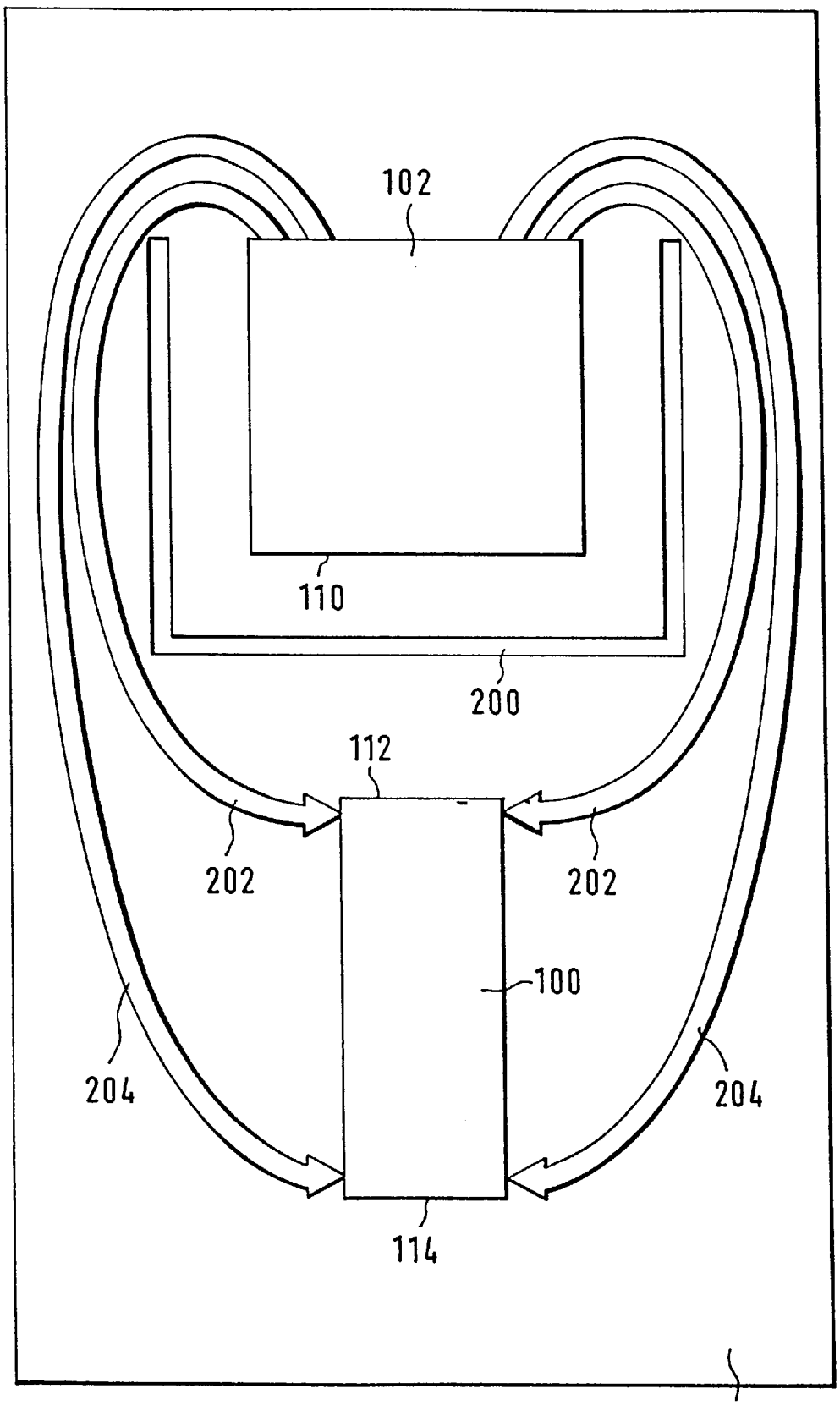
FIG. 2 is a top view of the electronic assembly of FIG. 1 with improved thermal characteristics in accordance with the invention.

FIG. 2 illustrates the assembly of FIG. 1 with an example embodiment of the invention. In the assembly of FIG. 2, an opening 200 (a long narrow slit in the example embodiment) is formed completely through the substrate 104 on three sides of device 102. Arrows 202 and 204 illustrate thermally conductive paths. The shortest conductive paths 202 in FIG. 2 are substantially longer than the shortest conductive paths 106 of FIG. 1. As a result, more heat dissipates by radiation and convection for paths 202 (FIG. 2) than for paths 106 (FIG. 1) so that less heat reaches device 100. In addition, the ratio of the lengths of paths 202 and 204 (FIG. 2) is closer to unity than the ratio of the lengths of paths 106 and 108 (FIG. 1). Therefore, the distribution of the heat reaching device 100 in the system of FIG. 2 is more uniform than the distribution of the heat reaching device 100 in the system of FIG. 1.

Note that the opening 200 provides thermal benefits with low complexity and low cost relative to heat sinks, Peltier devices, and temperature sensing devices. In addition, opening 200 may also be used in conjunction with the other techniques to improve the overall assembly. If the techniques are combined, using the opening 200 reduces overall heat transfer, reducing the compensation required by a heat sensor system, or enabling use of a smaller heat sink, or enabling use of a smaller Peltier device.

The opening 200 in FIG. 2 may be formed mechanically (for example, by sawing), chemically (etching) or cutting (laser) after the substrate 104 is formed. Alternatively, the substrate 104 may be originally formed with the opening. Preferably, for ceramic substrates, corners should be rounded to prevent cracking. Typically, the location of the opening is not important as long as the lengths of the shortest thermal path lengths between the devices are increased. For example, the opening can be around device 100 instead of around device 102. However, in some systems, it may be preferable to isolate a heat source as far away as possible from a temperature sensitive device so placing the opening near the heat source may be preferable. Except for rounded corners, the shape of the opening is not important. A single simple straight line, two lines forming a "V" or "L" shape, three lines forming a square "U" shape (as illustrated), curved lines, or even a serpentine path can be formed to further increase the length of the thermal paths, further decreasing heat transfer and improving uniformity of distribution of the remaining heat. Again, the general goal is to increase the shortest thermal path lengths between one device having variable temperature and another device having temperature sensitivity and there are many alternative shapes and locations of openings that can achieve the goal.

A specific application of the invention is for spectrometer assemblies used in analytical chemistry instrumentation. Chemical analyzers using liquid chromatography or capillary electrophoresis typically include individual photosensors or a photosensitive array within a spectrometer. A chemical mixture that is changing over time exits a chemical separation apparatus. A broad band radiation source impinges onto the chemical mixture. The broad band light is separated by a wavelength dispersive element—typically a diffraction grating—and the spectrometer measures portions of the radiation that are absorbed by the chemicals exiting the chemical separation apparatus. In spectrometers having individual photosensors, the grating is typically turned so that one narrow band of wavelengths impinges on a photosensor at any one time. For spectrometers having arrays of photosensors, all wavelengths of interest are detected simultaneously.

Spectrometers used in analytical chemistry typically require linearity over a large dynamic range. For example, in automated chemical manufacturing, standard samples may be highly concentrated, absorbing essentially all the light at particular wavelengths. In contrast, in diagnostic applications, a sample may have only a minute trace of a substance of interest, so that very little light is absorbed at wavelengths of interest. As a result, the dynamic range is large and the system requires detection of very small changes on large signals.

Typically, an inherent capacitance associated with each photosensor is charged in the dark and each photosensor discharges its associated capacitance when exposed to light. Temperature affects the amount of current that flows even when no light is impinging (dark current), the discharge rate (quantum efficiency) and noise and offset generated by associated electronics such as amplifiers and analog-to-digital converters. In addition, because of dimensional changes, temperature affects the positional accuracy of individual photodiodes within diode arrays relative to wavelength positions from the diffraction grating.

Figure 3:
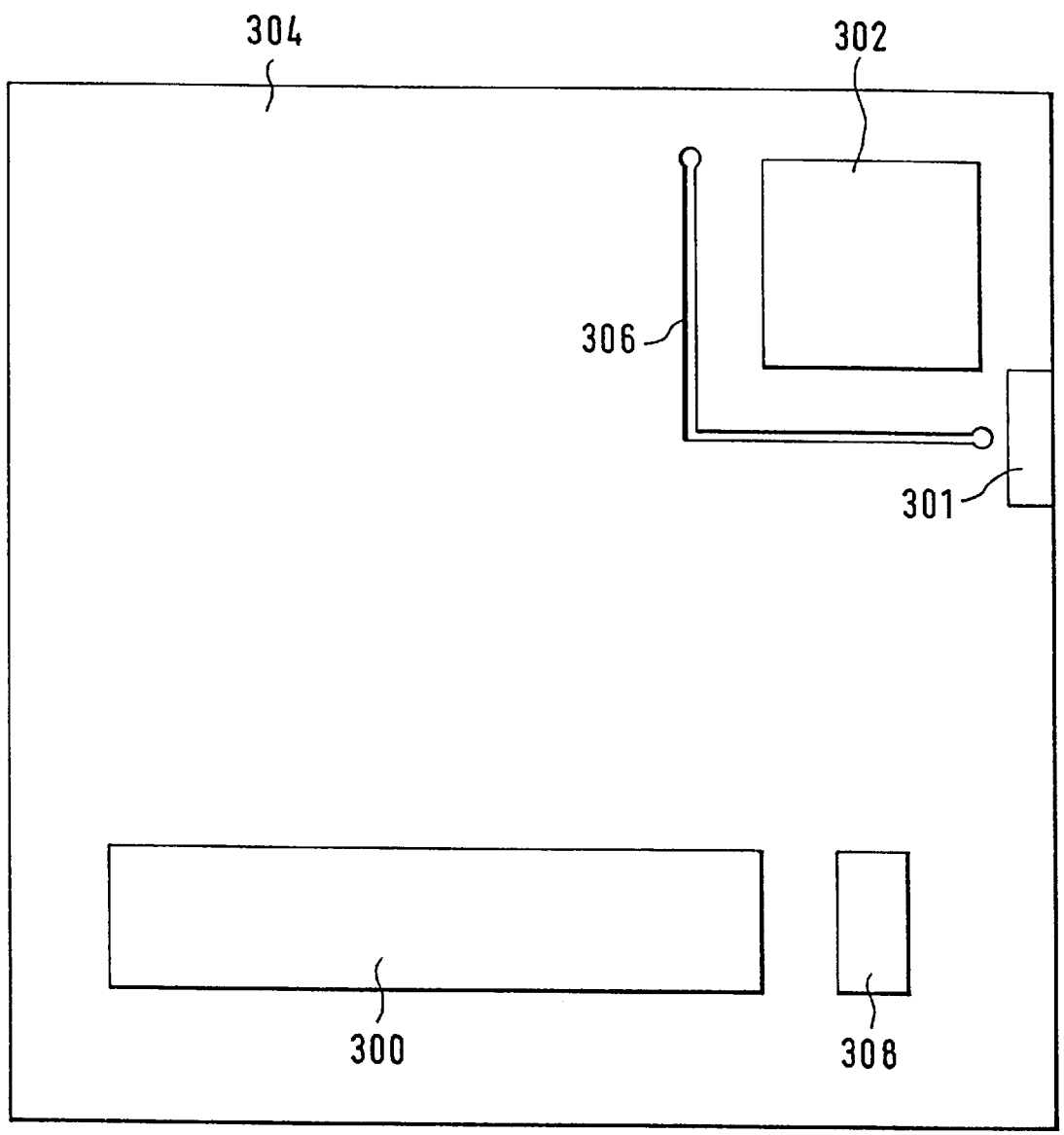
FIG. 3 is a top view of an example embodiment of an opening in a substrate to improve thermal characteristics.

FIG. 3 illustrates an example spectrometer sensor embodiment. A photodiode array 300 and an operational amplifier circuit 302 (used to amplify signals from the photodiode array) are both mounted onto a common ceramic substrate 304. In order to minimize the effects of electromagnetic noise received from other parts of the system, the amplifier should have a low input impedance and should be placed physically close to the sensor outputs (which often have a high impedance output). The photodiode array 300 in the specific embodiment is relatively long and narrow (approximately 27 mm long and 4 mm wide). Therefore, because of the long narrow shape, uniformity of heat transfer is a problem. In addition, the time period for change of the optical signal being measured and the heat transfer time (from the amplifier circuit to the sensor assembly) are both on the order of several seconds. The net effect of the electronic result of the thermal feedback may be a positive feedback or a negative feedback but in either case, the feedback results in noise that is proportional to the signal. The effects of random noise can be reduced by time averaging but noise proportional to the signal is not reduced by averaging. However, a temperature sensor may be used to partially compensate for thermal feedback.

In FIG. 3, an opening 306 in the substrate is used to reduce the amount of heat transferred from the amplifier circuit and to improve the uniformity of the heat transferred. In the specific embodiment, the opening is "L" shaped around two sides of the operational amplifier circuit. In addition, heat sinking and temperature sensing are used to further reduce thermal effects. A conductive pad 301 used for a power supply connection also conducts heat away from the amplifier area into a connection tab (not illustrated). A temperature sensor 308 is used to measure temperature near one end of the photodiode array. The amplifier 302 is also used to amplify a signal from a temperature sensor 308. Signals from the photodiode array 300 and from the temperature sensor 308 are digitized and the digitized temperature sensor signals are used to numerically compensate the digitized photodiode signals. Finally, a conductive ground plane (not illustrated) over the back surface of the substrate 304 helps improve temperature uniformity. Of course, the open area 306 in the substrate also passes through the ground plane.

The location of the temperature sensor 308 relative to the heat source (amplifier 302) is important. If the temperature sensor is between the heat source and the photodiode array, the sensor temperature changes slightly earlier than the temperature of the photodiode array and the magnitude of temperature change at the temperature sensor is slightly higher than the magnitude of change at the photodiode array. The opposite is true if the photodiode array is between the temperature sensor and the heat source. Placing the temperature sensor at one end of the photodiode array helps both the accuracy of temperature measurement (of the photodiode array) and feedback timing. In the embodiment illustrated in FIG. 3, an additional source of heat is infrared wavelengths in the light being measured. The sensor is placed near the end of the photodiode array that receives light in the infrared wavelengths.

An opening in a substrate for heat isolation is also useful in spectrometers having individual photosensors. Typically, two photosensors are used, one sensor detecting light directly from the radiation source and a second sensor detecting light that has passed through the chemical mixture. Subtracting the output of the second sensor from the output of the first sensor partially compensates for fluctuations in intensity from the radiation source. The two photosensors need to be matched as closely as possible. The two sensors are preferably cut from the same piece of material to ensure matching thermal properties. In addition, it is beneficial to mount both sensors on a common substrate to ensure identical thermal environments. In addition, it is beneficial to mount associated amplifiers on the substrate with the sensors to provide identical thermal environments for the amplifiers as well as the photosensors and to minimize the effects of electromagnetic noise. However, at each narrow band of wavelengths, the signal to the first amplifier from the first sensor and the signal to the second amplifier from the second sensor may be identical or may be substantially different depending on light absorption at the particular band of wavelengths. Therefore, the amplifiers sometimes generate heat identically and at other times generate heat at substantially different rates. Over a relatively short time period, the heat received by one of the photosensors from the amplifiers may be different than the heat received by the other photosensor from the amplifiers. Therefore, there is a need to reduce the effects of amplifier heat generation on the photosensors. Openings in the substrate reduce the effects of rapid temperature variations proportional to signal changes while the common substrate still provides a common surrounding thermal environment for longer term thermal matching.

The invention claimed is:

1. An electronic apparatus having improved thermal characteristics, the apparatus comprising:
   first and second devices mounted on a substrate, a shortest straight line existing between the first and second devices;
   first device being sensitive to changing temperature and the second device causing a variable temperature at the first device;
   the first and second devices located on the substrate at positions that reduce thermal transfer between the first and second devices by convection and radiation; and an opening through the substrate, blocking thermal conduction along the shortest straight line, thereby causing a shortest thermal conduction path between the first and second devices to be longer than the shortest straight line.

2. The apparatus of claim 1 in which the first device is a photodiode.

3. The apparatus of claim 1 in which the first device is a photodiode array.

4. The apparatus of claim 3 further comprising:
   the photodiode array having a first end; and
   a temperature sensor placed near the first end of the photodiode array.

5. The apparatus of claim 4 further comprising:
   the first end of the photodiode array adapted for receiving infrared light.

* * * * *